United States Patent [19]

Willer

[11] Patent Number: 4,889,827

[45] Date of Patent: Dec. 26, 1989

[54] METHOD FOR THE MANUFACTURE OF A MESFET COMPRISING SELF ALIGNED GATE

[75] Inventor: Josef Willer, Oberschleissheim, Fed. Rep. of Germany

[73] Assignee: Siemens Aktiengesellschaft, Berlin and Munich, Fed. Rep. of Germany

[21] Appl. No.: 247,662

[22] Filed: Sep. 22, 1988

[30] Foreign Application Priority Data

Sep. 23, 1987 [DE] Fed. Rep. of Germany ..... 37332048

[51] Int. Cl.[4] .................. H01L 21/316; H01L 21/283
[52] U.S. Cl. ........................................ 437/41; 437/44;
  437/45; 437/176; 437/175; 437/203; 437/238;
  437/912; 148/DIG. 139; 148/DIG. 140;
  148/DIG. 168; 357/22
[58] Field of Search ............... 437/175, 176, 177, 178,
  437/179, 203, 912, 38, 39, 41, 44, 45; 357/23.2,
  22; 148/DIG. 139, DIG. 140, DIG. 168

[56] References Cited

U.S. PATENT DOCUMENTS

| 4,472,872 | 9/1984 | Toyoda et al. | 437/912 |
| 4,551,905 | 11/1985 | Chao et al. | 437/203 |
| 4,616,400 | 10/1986 | Macksey et al. | 437/912 |
| 4,774,206 | 9/1988 | Willer | 437/175 |

FOREIGN PATENT DOCUMENTS

| 87102395.8 | 2/1987 | European Pat. Off. | |
| 0076771 | 7/1978 | Japan | 357/23.2 |
| 0145377 | 9/1982 | Japan | 437/179 |
| 0099380 | 5/1986 | Japan | 357/22 K |

OTHER PUBLICATIONS

*IBM Technical Disclosure Bulletin*, "Self-Aligned Recessed Gate MESFET", vol. 28, No. 3, Aug. 1985, pp. 916–917.
C. E. Weitzel et al., "A Review of GaAs MESFET Gate Electrode Fabrication Technologies", *Journal of the Electrochemical Society*, Oct. 1986, pp. 409C–416C.
Yokoyama et al., "A Self-Aligned Source-Drain Planar Device for Ultra-High Speed GaAs MESFET VLSIs", *IEEE International Solid State Circuits Conference*, 1981, pp. 218–219.

*Primary Examiner*—Brian E. Hearn
*Assistant Examiner*—T. N. Quach
*Attorney, Agent, or Firm*—Hill, Van Santen, Steadman & Simpson

[57] ABSTRACT

A method for the manufacture of a MESFET comprising a gate that is self-aligned both with respect to the source and drain regions as well as with respect to the appertaining metallizations, whereby a first metal layer (21), a first dielectric layer (31), and a first lacquer mask layer are applied following doping of the carrier substrate. A trench producing an outer recess in the doping layer (11) is formed by anisotropic etching. A second dielectric layer is isotropically deposited and is anisotropically re-etched except for spacers (51/52) whereby an inner recess (double recess) is produced in the doping layer and, finally, the gate metal (22) is applied.

20 Claims, 3 Drawing Sheets

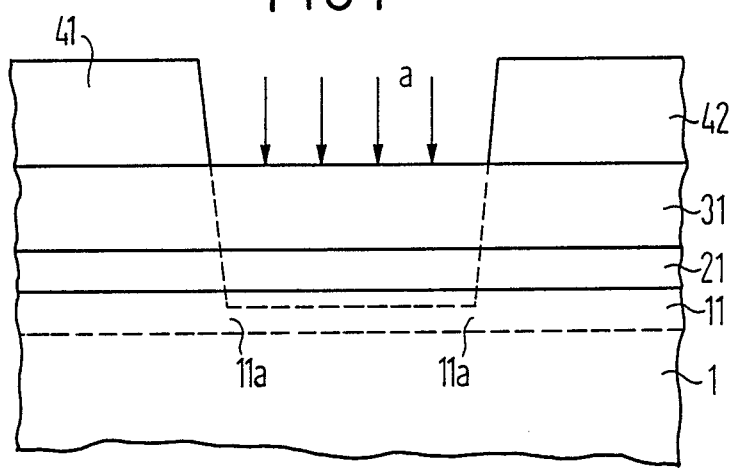
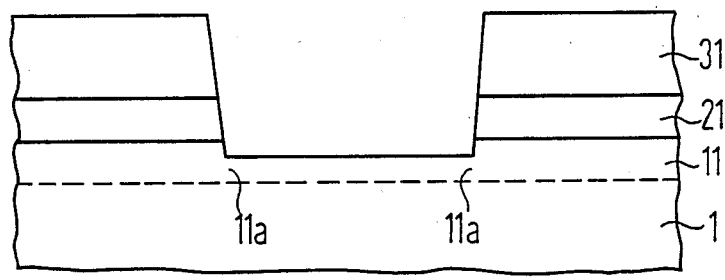

METHOD FOR THE MANUFACTURE OF A MESFET COMPRISING SELF ALIGNED GATE

BACKGROUND OF THE INVENTION

The present invention is directed to a method for manufacturing a MESFET comprising self-aligned gate. More specifically, the present invention is directed to the manufacture of a MESFET having a self-aligned gate comprising a first metal layer, a second metal layer as the gate metal, a first dielectric layer, a first spacer and a second spacer, wherein implantation, mask, anisotropic etching, and lift off techniques, as well as, curing process are employed.

An increasingly number of processes have been developed wherein the gate is formed in the manufacture of MESFET components in self-aligning fashion, particularly within the framework of GaAs technology. Manufacturing methods wherein the source and drain regions are also formed in a self-aligning fashion, in addition to the gate region, are of special significance and interest.

The goal of a complete self-alignment wherein the metal contacts for source, drain, and gate are also applied in self-aligning fashion is to reduce the source-to-drain spacing in comparison to the traditional techniques. The goal is also to reduce the gate length down to approximately 0.1 $\mu$m given the simultaneous utilization of optical lithography. The source-to-gate spacing or, respectively, the spacing between the n+ doped region and the gate, as well, as the shorter gate length therewith simultaneously achieved, leads to lower resistances and capacitances, this has a very advantageous effect on the high frequency compatibility.

An overview of the currently used standard manufacturing processes of MESFET gates is provided in an article by C. E. Weitzel and D. A. Doane, "A Review of GaAs MESFET Gate Electrode Fabrication Technologies" in Journal of the Electrochemical Society 133, pages 409C through 416C (1986).

IBM Technical Disclosure Bulletin 28, pages 916 through 917 (1985), describes the manufacture of a MESFET wherein source and drain regions and their respective metallizations are manufactured self-aligned. Standard technologies such as molecular beam epitaxy or chemical vapor deposition (CVD), and ion etching are thereby applied. A channel layer of n-doped GaAs is epitaxially grown on a substrate of semi-insulating GaAs. What is referred to as a contact layer of highly n-conductively doped GaAs then follows, forming the source and drain regions. The metal layer that forms the electrodes for the contacting is subsequently applied and is covered from above with an insulator layer of, for example, $SiO_2$. A trench is etched out through the contact layer, through the metal layer, and through the insulator layer. The side walls of the trench are provided with spacer regions (spacers) in a further process step. The metal of the gate metallization is applied between these spacers; these are referred to as "side walls" in the publication.

As an alternative embodiment, the authors propose that the application of the channel layer be forgone and the doping required for the channel region be instead introduced into the substrate by ion implantation before the application of the spacers. This manufacturing process involves the considerable disadvantage that an additional expitaxial step is required for the formation of the highly n-conductively doped source and drain regions. The application of the channel layer requires a further epitaxial step or the channel region must be created by subsequent ion implantation; this then requires high-temperature-stable metallizations because of the curing process that is required. No teaching can be derived from the publication whether this subsequent formation of the channel region supplies a usable junction between this channel region and the highly doped source and drain regions. Some structuring or other of the channel region is not provided.

U.S. Pat. No. 4,472,872 discloses a method wherein an active layer is applied to a GaAs substrate by doping and a layer sequence of gold-germanium alloy as a metal layer for the ohmic contacting and aluminum that is interrupted by a trench is applied on the active layer with lift-off technique. Spacers are then created on the sides of the trench and, after removal of the aluminum layer, a platinum layer is applied for outer contacting, whereby the spacers are simultaneously intended to effect the interruption between source, gate, and drain contact. In a last step, the spacers are removed, as well as part of the gate metal together with the spacers. A n+-doping of the source and drain regions is not possible in this method.

European patent application 87102395.8 discloses a method wherein a contact layer of metal and a dielectric layer are applied onto a substrate. A trench-shaped recess comprising a masking element with under-cut shape is achieved. Spacers are subsequently created by anisotropic etching of a further dielectric layer that is isotropically applied surface-wide. The gate metal is applied between these spacers. Depending on the doping process utilized, a depression can be etched into the substrate surface in order to constrict the channel region before the deposition of the gate metal.

Through the dummy gate technique, a dummy gate is first deposited, and serves as an implantation mask. The dummy gate is replaced by a gate metal after further process steps. This technique is self-aligning with respect to the source, drain, and gate regions, but not with respect to the corresponding contact metals.

The spacer technique of NEC, eliminates the n+-regions, because the metal for the ohmic contacts move toward the gate edges self-aligned. A simple T-gate having large cross-section is not possible, this having a disadvantageous influence on the structure sophistication.

The SAGFET method deriving from a proposal by Fujitsu (M. Yokoyama et al in IEEE ISSCC 1981, pages 218 through 219) has been investigated in various embodiments. They all require a Schottky contact that resists the curing procedure following the implantation, this presents a great problem. This method is self-aligning with respect to the n+-implantation and with respect to the gate region.

In the SAINT process, the n+ implantation is limited by a photoresist structure with a $SiO_2$ cover layer. After various process steps, the lacquer structure is replaced by the gate metal that is self-aligned with respect to the source and drain regions but not with respect to the source and drain metal contacts. A structural sophistication thereby requires nonlight-optical lithography.

SUMMARY OF THE INVENTION

The present invention provides a method for manufacturing a MESFET wherein the gate is manufactured self-aligning with respect to the source and drain regions, as well as with respect to the source and drain metallizations. The MESFET is manufactured in an optimally simple way that encompasses optimally few process steps and wherein the channel region can be structured such that low threshold voltage and high breakdown voltage are achieved.

To this end, the present invention provides a method for the manufacture of a MESFET having a self-aligned gate comprising a substrate of semiconductor material, a first metal layer, a second metal layer as the gate metal, a first dielectric layer, a first spacer, and a second spacer, wherein implantation technique, curing process, mask technique, anisotropic etching technique, and lift-off technique are utilized. The method includes the steps of forming a doping layer with selective implantation and subsequent curing at the surface of the substrate. The first metal layer, composed of a metal employable for ohmic contact, is applied surface-wide on the doping layer. The first dielectric layer is applied on the metal layer. A first lacquer mask layer is applied on the dielectric layer. A trench is etched out with anisotropic etching in the region left free by the first lacquer mask layer, the trench is etched out through the first dielectric layer and through the first metal layer down into the doping layer of the substrate so that an outer recess of the substrate surface derives in this doping layer. The trench is etched to such a depth into the doping layer of the substrate that, taking the doping profile of the doping layer into consideration, the prescribed minimum breakdown voltage for the gate to be manufactured is assured. A second dielectric layer is applied with isotropic deposition onto the surface structured in the recited way. The second dielectric layer is etched away with anisotropic etching except for a first spacer and a second spacer. And the second metal layer is applied as a gate metal.

In an embodiment of the invention, the second metal layer is initially applied surface-wide and is subsequently structured by etching.

In an embodiment of the invention, the gate metal is applied with lift-off technique in such manner that: a second lacquer mask layer is first applied; a second metal layer is applied by directed deposition, whereby a first portion of the second metal layer forms the gate metallization and a second portion of the second metal layer is situated on the second lacquer mask layer and the second portion of the second metal layer is lifted off together with the second lacquer mask layer.

In an embodiment of the invention, the substrate is a III–V semiconductor material.

In an embodiment of the invention, silicon dioxide is deposited as a dielectric.

In an embodiment of the invention, the curing of lattice damages that may have arisen in the semiconductor material is effected in additional tempering steps before the deposition of the gate metal.

Additional features and advantages of the present invention will be apparent from the detailed description of the presently preferred embodiments and from the drawings.

BRIEF DESCRIPTION OF THE DRAWINGS

FIGS. 1–6 illustrate cross-sectional perspective views of the component, illustrating the gate region, source region, and drain region during the method of the present invention.

DETAILED DESCRIPTION OF THE PRESENTLY PREFERRED EMBODIMENTS

Figure 3:
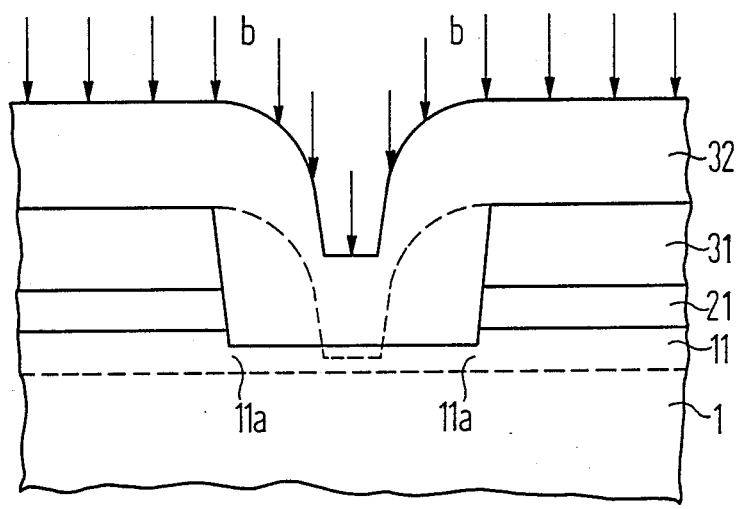

The present invention provides a method for the manufacture of a MESFET wherein the gate is manufactured self-aligning with respect to the source and drain regions as well as with respect to the source and drain metallizations. Pursuant to the method of the present invention, the MESFET is manufactured in an optimally simple way that encompasses optimally few process steps and wherein the channel region can be structured such that low threshold voltage and high breakdown voltage are achieved.

The process of the present invention provides the following aspects. A layer at the surface of the substrate is doped by selective implantation and potential lattice damage is cured. The surface of this doping layer is provided with a first metal layer surface-wide, this first metal layer forming an ohmic contact with the semiconductor material of the substrate. A first dielectric layer of, for example, silicon dioxide is applied surface-wide to the first metal layer.

The surface of the first dielectric layer is provided with a photoresist mask. Through an anisotropic etching process (for example, ion bombardment or RIE), a trench is etched out in that part of the component provided for the gate region and that is left free of the lacquer mask layer. That part of the component is etched out through the dielectric layer and metal layer down into the doping layer of the substrate. This anisotropic process is continued to such an extent into the doping layer of the substrate that, in combination with the following process steps and taking the doping profile of the doping layer into consideration, the finished gate has a geometrical structure that guarantees the desired physical properties, particularly low threshold voltage and high breakdown voltage.

The lacquer mask layer is removed and the structured surface is covered with a second dielectric layer. The second dielectric layer can be, for example, silicon dioxide, that is applied through a method of isotropic deposition, for example CVD (chemical vapor deposition). This second dielectric layer is subsequently anisotropically re-etched with ion etching or RIE, so that what are referred to as spacers remain standing at the side walls of the trench that is etched out in the preceding process steps. For the etching process, for example, sulfur hexaflouride ($SF_6$), potentially with $O_2$ or carbon tetraflouride ($CF_4$) here, too, potentially with $O_2$, can be utilized.

The thickness of the doping layer of the substrate can be reduced further by etching in the region between the spacers. This can be carried out through the use of chlorine-containing gases or by ion bombardment. A double constriction of the channel region (double recess) is produced with this procedure and the threshold voltage of the transistor is thereby set.

In a following tempering step, the lattice damage in the semiconductor material, particularly in the region between the source and drain, that has arisen in the preceding process steps can be cured. The gate metal is subsequently applied, which can be, for example, a layer sequence of titanium-platinum-gold. The structuring of the gate metallization occurs either by etching following surface-wide deposition or through a lift-off technique following directed deposition.

Refering now to the figures, FIG. 1 illustrates the gate region with the substrate 1 comprising the doping layer 11 after the application of the first metal layer 21, of the first dielectric layer 31, and of the first lacquer mask layer 41, 42. The vertical arrows indicate the process step of anisotropic etching a. This etching step is advanced to such an extent until the trench (illustrated by a broken-line contour) is etched out in the first dielectric layer 31, in the first metal layer 21, and in the upper region of the doping layer 11.

FIG. 2 illustrates the gate region after the anisotropic etching a and subsequent removal of the first lacquer mask layer 41, 42. A strip-shaped region at which position the thickness of the doping layer 11 is reduced is located under the etched trench. The deeply underlying parts of the side walls of the etched trench form a recess 11a in the surface of the doping layer 11 of the substrate 1.

FIG. 3 illustrates the gate region after the isotropic deposition of the second dielectric layer 32. A following step of anisotropic etching b is indicated by vertical arrows. In this etching step, the second dielectric layer 32 is etched back to the same thickness everywhere in a vertical direction, i.e., in the direction indicated by the arrow. That part of the second dielectric layer 32 situated on the first dielectric layer 31 is thereby completely etched off. As a consequence of the anisotropy of this etching step, two spacers, a first spacer 51 and a second spacer 52, remain in the trenches etched out in the preceding process steps.

Figure 4:
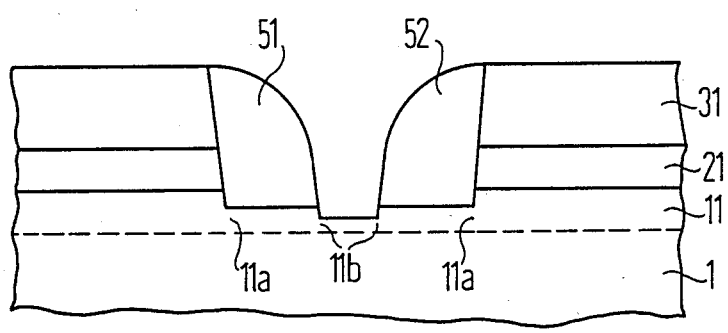

FIG. 4 illustrates the structure of the gate region following the etching step that has just been described. The gate region can be continued between the spacers 51, 52 into the doping layer 11 of the substrate 1, so that an inner region of again-reduced thickness of this doping layer 11 derives in this doping layer 11. The doping layer 11 of the substrate 1 therewith receives a further, inner recess 11b. The surface of the doping layer 11 of the substrate 1 comprises an outer recess 11a in this case that is about 1.2 um long. The threshold voltage of the transistor can be set to a prescribed value by etching out the inner region of the additionally reduced thickness of the doping layer 11. The double recess deriving from the combination of outer recess 11a and inner recess 11b allows their threshold voltage to be kept low and simultaneously allows the breakdown voltage between gate and source or, respectively, drain to be kept high.

Figure 5:
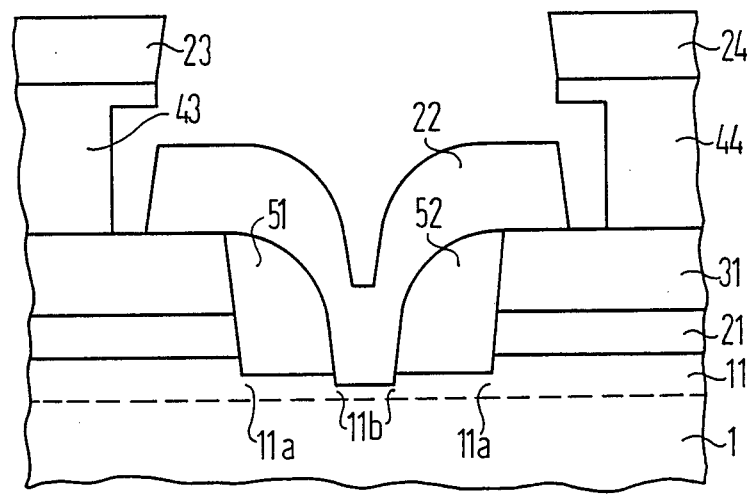

FIG. 5 illustrates the structure of the gate region after the application of a second lacquer mask layer 43, 44 and subsequent anisotropic application of the gate metallization, whereby a second metal layer 22, 23, 24 is applied. This second metal layer is composed of a first portion 22 that forms the gate metallization and of a second portion 23, 24 on the second lacquer mask layer 43, 44. This second portion 23, 24 of the second metal layer is lifted off together with the second lacquer mask layer 43, 44.

Figure 6:
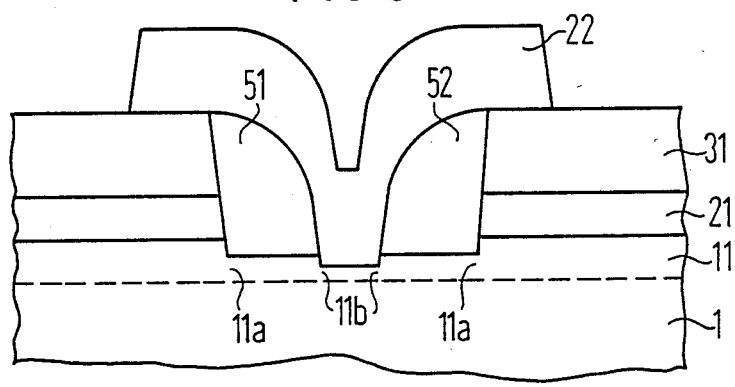

FIG. 6 illustrates the finished gate following the last process step. It is composed of the substrate 1 comprising the doping layer 11 in whose surface an outer recess 11a and an inner recess 11b are created, it is further composed of the metal layer 21 thereon and the dielectric layer 31 comprising the trench-shaped recess containing the two spacers 51, 52 and comprising the gate metal 22.

Since the metal layer for the ohmic contact need not be simultaneously alloyed in with the curing process of the implanted doping in the proposed process of the present invention, both a conventional as well as a high-temperature-resistant contact can be used for the ohmic contact. The process of the invention is self-aligning and simultaneously passivates the GaAs surface in the active region. Although the finest structures currently manufacturable with optical lithography otherwise lie at 0.7 $\mu$m, MESFETs having a 0.1 $\mu$m gate length can be manufactured with the process of the present invention. Despite the short gate length, the gate metal cross-section is kept large so that large gate widths can be realized. The overall structuring steps can be executed in by dry etching technique, i.e., all metals can be high-temperature-stable (refractory metals).

It should be understood that various changes and modifications to the presently preferred embodiments described herein will be apparent to those skilled in art. Such changes and modifications can be made without departing from the spirit and scope of the present invention and without diminishing its attendant advantages. It is therefore intended that such changes and modifications be covered by the appended claims.

We claim:

1. A method for the manufacture of a MESFET having a self-aligned gate comprising a substrate of semiconductor material, a first metal layer, a second metal layer as a gate metal, a first dielectric layer, a first spacer, and a second spacer, employing implantation technique, curing process, mask technique, anisotropic etching technique, and lift-off technique, the method including the steps of:

forming a doping layer with selective implantation and subsequent curing at the surface of the substrate;

a first metal layer, composed of a metal employable for ohmic contact, is applied surface-wide on said doping layer;

a first dielectric layer is applied on the metal layer;

a first lacquer mask layer is applied on the dielectric layer;

a trench is etched out with anisotropic etching in the region left free by the first lacquer mask layer, the trench being etched out through the first dielectric layer and through the first metal layer down into the doping layer of the substrate so that an outer recess of the substrate surface derives in this doping layer;

the trench is etched to such a depth into the doping layer of the substrate that, taking the doping profile of the doping layer into consideration, the prescribed minimum breakdown voltage for the gate to be manufactured is assured;

a second dielectric layer is applied with isotropic deposition onto a surface structured in the recited way;

the second dielectric layer is etched away with anisotropic etching except for a first spacer and a second spacer; and a second metal layer is applied as gate metal.

2. The method of claim 1 wherein the second metal layer is initially applied surface-wide and is subsequently structured by etching.

3. The method of claim 1 wherein the gate metal is applied with lift-off technique in such a fashion that:

a second lacquer mask layer is first applied;

a second metal layer is applied by directed deposition, whereby a first portion of the second metal layer forms the gate metallization and a second portion of the second metal layer is situated on the second lacquer mask layer; and the second portion of the second metal layer is lifted off together with the second lacquer mask layer.

4. The method of claim 1 wherein the substrate is a III–V semiconductor material.

5. The method of claim 1 wherein silicon dioxide is deposited as a dielectric.

6. The method of claim 1 wherein the substrate is GaAs.

7. The method of claim 1 wherein lattice damages that may have arisen in the semiconductor material are cured by additional tempering steps before the deposition of the gate metal.

8. The method of claim 1 wherein following the anisotropic etching of the second dielectric layer the doping layer of the substrate is etched deeper between the first and second spacers for setting the threshold voltage of the transistor, so that an inner recess of the substrate surface derives in the doping layer.

9. The method of claim 3 wherein the substrate is a III–V semiconductor material.

10. The method of claim 3 wherein silicon dioxide is deposited as a dielectric.

11. The method of claim 3 wherein the substrate is GaAs.

12. The method of claim 3 wherein lattice damages that may have arisen in the semiconductor material are cured by additional tempering steps before the deposition of the gate metal.

13. The method of claim 3 wherein following the anisotropic etching of the second dielectric layer the doping layer of the substrate is etched deeper between the first and second spacers for setting the threshold voltage of the transistor, so that an inner recess of the substrate surface derives in the doping layer.

14. A method for the manufacture of a MESFET having a self-aligned gate comprising the steps of:
   forming a doping layer with selective implantation and subsequent curing at a surface of a semiconductor material substrate;
   a first metal layer, composed of a metal employable for ohmic contact, is applied surface-wide on said doping layer;
   a first dielectric layer is applied on the metal layer;
   a first lacquer mask layer is applied on the dielectric layer;
   a trench is etched out with anisotropic etching in a region that does not include the first lacquer mask layer, the trench being etched out through the first dielectric layer and through the first metal layer down into the doping layer of the substrate creating an outer recess of the substrate in the doping layer;
   the trench is etched to such a depth into the doping layer of the substrate that a prescribed minimum breakdown voltage for the gate to be manufactured is assured;
   a second dielectric layer is applied with isotropic deposition onto a so structured surface;
   the second dielectric layer is etched away with anisotropic etching except for a first spacer and a second spacer; and
   a second metal layer is applied as gate metal.

15. The method of claim 14 wherein the second metal layer is initially applied surface-wide and is subsequently structured by etching.

16. The method of claim 14 wherein the gate metal is applied with lift-off technique in such a fashion that:
   a second lacquer mask layer is first applied;
   a second metal layer is applied by directed deposition, whereby a first portion of the second metal layer forms the gate metallization and a second portion of the second metal layer is situated on the second lacquer mask layer; and
   the second portion of the second metal layer is lifted off together with the second lacquer mask layer.

17. The method of claim 14 wherein the substrate is a III–V semiconductor material.

18. The method of claim 14 wherein silicon dioxide is deposited as a dielectric.

19. The method of claim 14 wherein lattice damages that may have arisen in the semiconductor material are cured by additional tempering steps before the deposition of the gate metal.

20. The method of claim 14 wherein following the anisotropic etching of the second dielectric layer the doping layer of the substrate is etched deeper between the first and second spacers for setting the threshold voltage of the transistor, so that an inner recess of the substrate surface derives in the doping layer.

* * * * *